United States Patent [19]

Brugliera et al.

[11] Patent Number: 4,631,601
[45] Date of Patent: Dec. 23, 1986

[54] TIME PROGRAMMABLE CONTROL SYSTEM FOR A CONVERTER/VCR SYSTEM

[75] Inventors: Vito Brugliera, Evanston; George R. J. Green, Algonquin; Michael E. Long, Western Springs, all of Ill.

[73] Assignee: Zenith Electronics Corporation, Glenview, Ill.

[21] Appl. No.: 658,105

[22] Filed: Oct. 5, 1984

[51] Int. Cl.[4] .......................................... H04N 5/782
[52] U.S. Cl. ..................................... 358/335; 360/33.1
[58] Field of Search .............. 358/335, 337, 181, 188, 358/86; 360/33.1, 137; 369/19, 20; 455/171, 179, 181

[56] References Cited

U.S. PATENT DOCUMENTS

| 3,936,752 | 2/1976 | Sasabe et al. | 455/181 |
|---|---|---|---|
| 4,081,754 | 3/1978 | Jackson | 455/181 |
| 4,193,120 | 3/1980 | Yello | 358/335 |
| 4,325,081 | 4/1982 | Abe et al. | 358/335 |
| 4,435,842 | 3/1984 | Mayumi et al. | 455/181 |
| 4,488,179 | 12/1984 | Kruger et al. | 358/181 |

Primary Examiner—Donald McElheny, Jr.

[57] ABSTRACT

A television signal converter includes ON/OFF means and channel selection means responsive to remotely transmitted infra-red command signals. The signal channel frequency output of the converter is coupled to the input of a VCR having program means enabling a user to determine a recording time schedule. A microprocessor driven programmable remote command signal transmitter supplied ON/OFF and channel selection command signals to the converter.

5 Claims, 1 Drawing Figure

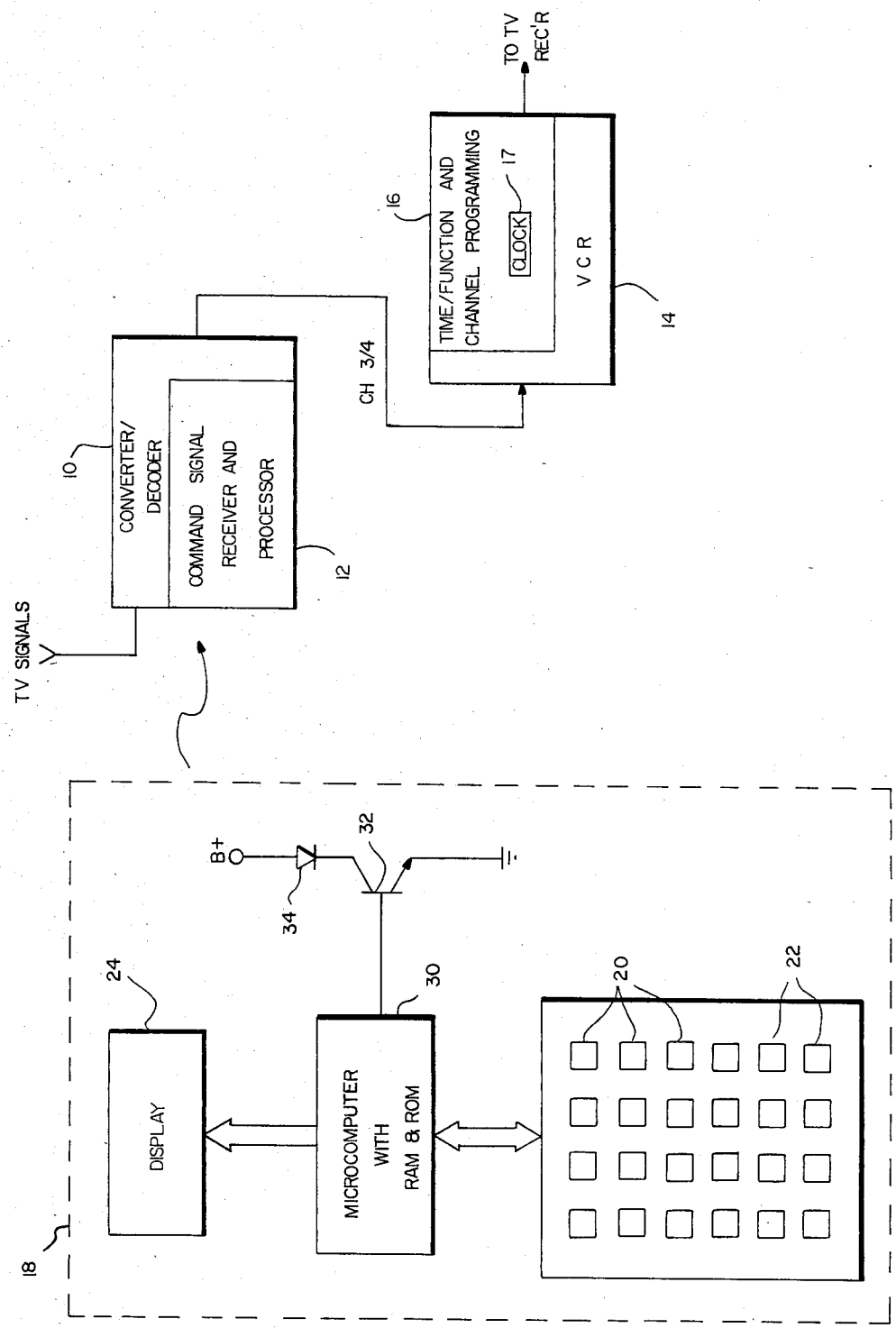

TIME PROGRAMMABLE CONTROL SYSTEM FOR A CONVERTER/VCR SYSTEM

BACKGROUND OF THE INVENTION AND PRIOR ART

This invention relates generally to video cassette recorders (VCRs) and, specifically, to VCRs used in conjunction with television signal converters.

Most VCRs include user programmable ON/OFF and channel selection means for initiating and stopping recording of television signals on different television channel frequencies according to a user determined time schedule. Conventional VCRs may be programmed to record a plurality of television programs (events) extending over a substantial time period, generally limited by the number of events to be recorded and the length of the recording tape. Thus a user may program the VCR to automatically record one or more desired television programs on a number of different channels while the viewer is away from home or otherwise occupied for later, more convenient, viewing.

A large number of VCR users receive television signals over a cable in which the cable operator supplies his subscribers with locally receivable over-the-air television transmissions, in addition to other program signals, on a single cable installation. The subscriber receives a converter unit for translating the cable channel television signals to a single VHF channel frequency for viewing on the subscriber's television receiver. The converter unit may also incorporate a decoder for unscrambling selected channel signals which are available for an additional charge.

The converter unit is usually controllable from a remote point. Thus the subscriber is provided with a portable command signal transmitter for controlling operation of the converter unit. Generally the user may remotely turn the converter unit on and off, change the cable channel to which it is tuned and, in baseband systems, adjust and mute the volume in the audio of the received signal. The converter unit includes a command signal control unit for receiving the command signals and for performing the indicated functions.

A cable subscriber with a programmable VCR suffers a disadvantage in recording flexibility because the converter unit is not programmable to change channel tuning and only delivers a single cable channel to the input of the VCR. This cable channel is normally provided on VHF channel 3/4 and appears at the output of the converter unit. While the VCR has programmable channel selection means, enabling it to tune to any channel frequency, in practice it is always turned to VHF channel 3/4 because that is the only input signal available from the converter unit. Consequently, because the converter unit has no channel programming capability and only provides a single VHF channel output, the VCR has only that single channel frequency for an input and its programming capabilities, in terms of channel selection, are nullified.

The prior art as exemplified by German Pat. No. DT 26 12 260 A1 discloses a programmable command signal transmitter for a television receiver to turn the receiver on at a selected time, tune it to a desired channel and to turn the television receiver off at another time. The transmitter includes clock-controlled means for producing the appropriate command signals at the selected times. The art suggests nothing in the way of a solution to the dilemma of the cable subscriber with a VCR.

OBJECTS OF THE INVENTION

A principal object of the invention is to provide a novel television signal receiving system.

Another object of the invention is to provide a novel converter VCR arrangement.

SUMMARY OF THE INVENTION

In accordance with the invention a converter including channel selection means is coupled to the input of a VCR that is user programmable for establishing a multi-event recording time schedule. A user programmable command signal generator, which may be in the form of a remote control transmitter, supplies command signals on a user determined time schedule, for controlling the converter time and channel selection operation to correspond to the recording time schedule established for the VCR.

BRIEF DESCRIPTION OF THE DRAWING

Further objects and advantages of the invention will be apparent by reading the following description in conjunction with the drawing, the single FIGURE of which is a block diagram illustrating the arrangement of the invention.

DESCRIPTION OF THE PREFERRED EMBODIMENT

Referring to the drawing, a source of television signals is supplied to a converter/decoder 10 which is indicated as including a command signal receiver and processor 12. Command signal receiver and processor 12 is well known in the art and generally comprises means for receiving command signals consisting of coded bursts of infra-red energy, decoding means for determining the command function and means for carrying out the command function, such as turning the converter unit ON or OFF, changing the cable channel frequency to which the converter unit is tuned and adjusting or muting the signal volume level. The output of converter/decoder 10 is supplied to the input of a programmable VCR 14 which includes a control section 16 containing Time/Function and Channel Programming means. The VCR control section also includes a clock 17 used in programming. The output of the VCR is generally supplied to a conventional television receiver (not shown), for viewing of either recorded material or input signals from the converter unit output.

In this invention the "playback" feature of the VCR is of no concern. Similarly the television receiver is not of interest. The VCR control section enables user programming of the VCR operation to turn ON on a given day and record at a selected time, a given channel frequency for a predetermined duration. The VCR may be capable of operating thusly for a number of different events on different days, times, channels and of different durations. With the converter connection illustrated, the channel selection ability of the VCR is not usable since it must be tuned to the channel frequency in the output of the converter/decoder, namely VHF channel $\tfrac{3}{4}$.

A user programmable command signal transmitter 18, illustrated in dashed lines, has a first group of command selection keys 20 for generating appropriate command signals for controlling the cable channel frequency to which the converter unit is tuned; adjusting or muting the volume of the program audio; and for turning the converter unit ON/OFF. Another group of keys 22 are used for programming a command signal time schedule for the transmitter. The programming is clock based and effects automatic transmission of appropriate command signals at dates and times programmed by the user. Thus, the transmitter includes a liquid crystal display 24 for indicating the correct time, the selected signal time, the command signal to be transmitted, the program cycle, etc. A microcomputer 30, with on-board ROM storing the program code and on-board RAM for recording the desired program recording schedule is coupled to the keyboard and supplies display 24. A transistor switch 32 is operated by the microcomputer and energizes an infra-red light emitting diode (LED) 34 connected in its output circuit. The LED thus transmits the coded signals to converter unit 10. The transmitter is battery powered and uses a Matshushita MN 15821 microcomputer. An exemplary program code for the microcomputer is attached hereto as an appendix.

With the invention, a user first establishes a desired program and time schedule on transmitter 18, including turn ON time, cable channel desired and the duration of the event. The converter unit may either be turned OFF between events or left operating and switched to a different cable channel at the next selected event recording time. The transmitter is capable of being programmed for a number of separate events at different times. The user would then program the VCR with time and duration information corresponding to the events programmed into the transmitter. The VCR would remain tuned to channel ¾ since that is the only channel frequency appearing in the output of the converter/decoder.

Obviously, the user must take care that the clock in the VCR and the clock in the transmitter are in agreement. At the appropriate preset time, the transmitter automatically sends an ON signal to the converter/decoder, followed by a channel selection signal for tuning the converter/decoder to the desired cable channel frequency. It will be appreciated that the converter/decoder may be left on continuously, with only the channel information being programmed in. At approximately the same time, the programmed VCR will turn ON to channel ¾ and begin recording the signal appearing at the output of the converter unit. The transmitter, after the allocated time period, automatically transmits either an OFF command signal to the converter/decoder or a channel change signal, depending upon the programming.

The VCR is controlled by its separate programming. If a simple channel change is involved, the VCR would be programmed to continue recording, whereas if a time interval between events is involved, the properly programmed VCR will be turned OFF in the interim. The cycle repeats for subsequent events until all events have occurred. Thus the cable subscriber, with a programmable VCR, is enabled to utilize the recording flexibility of his VCR and need not miss desired programs when he is away from home, or otherwise occupied, because the programs are presented on different cable channel frequencies.

It will be recognized that numerous changes in the described embodiment of the invention will be apparent to those skilled in the art without departing from its true spirit. For example, in an alternate embodiment, the programmability aspect of the invention could be implemented in the form of an appropriate programming system build directly into the converter unit rather than being provided in the form of a remote control transmitter. The invention is to be limited only as defined in the claims.

APPENDIX

```
0001
0002 ************************************
0003 *
0004 *   TAC-TIMER ROUTINES
0005 *
0006 *   (C) 1984      ZENITH ELECTRONIC CORP.
0007 *
0008 ************************************
0009 *   DISPLAY ROUTINES
0010 *
0011 ************************************
0012 *
= 0000         0013         BGN      A,X'00'
               0014 ************************************
               0015 *********
= 00C9         0016 IRD2     EQU      X'C9'
= 00C8         0017 IRD1     EQU      X'C8'
= 00DE         0018 KEY_MSD  EQU      X'DE'
= 00DD         0019 WORK     EQU      X'DD'
```

```
        = 00DC      0020 SWITCH  EQU   X'DC'
        = 0002      0021 KEY_JOB EQU   2
        = 0001      0022 KEY_BNCE EQU  1
        = 000D      0023 BLANK   EQU   X'D'
        = 000E      0024 DASH    EQU   X'E'
                    0025 *********************************
0000 A4C2           0026         JMP   INITIAL        * RESTART
                    0027 *********************************
        = 000C      0028         ORG   X'0C'
000C A6DA           0029         JMP   INTERRUP       * INTERRUPT
                    0030 *********************************
        = 0010      0031         ORG   X'010'         * LOOK UP FOR DAY ON
0010 CD             0032         DC    ITS_SUN
0011 F9             0033         DC    ITS_MON
0012 B4             0034         DC    ITS_TUE
0013 F6             0035         DC    ITS_WED
0014 BA             0036         DC    ITS_THU
0015 B7             0037         DC    ITS_FRI
0016 BD             0038         DC    ITS_SAT
0017 F8             0039         DC    NOT_HERE
                    0040 *********************************
                    0041 *********************************
        = 0018      0042         ORG   X'18'          * WAIT FOR IR
0018 36             0043 NTR_WAIT STE
0019 1FC9           0044 FULL    LD    X'C9'
001B 7D19           0045         JBNZ  1,FULL
001D 2F             0046         LE
001E 53C9           0047         STD   X'C9'
0020 34             0048         RET
                    0049 *********************************
        = 0021      0050         ORG   X'021'         * LOOK UP FOR P NUM ON
0021 A3             0051         DC    PROG_1
0022 A7             0052         DC    PROG_2
0023 A9             0053         DC    PROG_3
0024 A6             0054         DC    PROG_4
0025 D7             0055         DC    PROG_5
0026 I6             0056         DC    PROG_6
0027 D8             0057         DC    PROG_7
0028 D9             0058         DC    PROG_8
                    0059 *********************************
                    0060 *********************************
        = 0029      0061         ORG   X'29'          * DELAY BETWEEN IR
0029 F1             0062 HOLD_14 LI    X'1'
002A 53D7           0063         STD   X'D7'
002C 1FD7           0064 HOLD    LD    X'D7'
002E 7B2C           0065         JBZ   3,HOLD
0030 34             0066         RET
                    0067 *********************************
        = 0031      0068         ORG   X'031'         * LOOK UP FOR P DECODE
0031 70             0069         DC    X'70'          * 1 START DAY
0032 7A             0070         DC    X'7A'          * 2  " "
0033 84             0071         DC    X'84'          * 3  " "
0034 8E             0072         DC    X'8E'          * 4  " "
```

```
0035 98        0073         DC    X'98'         * 5  " "
0036 A2        0074         DC    X'A2'         * 6  " "
0037 AC        0075         DC    X'AC'         * 7  " "
0038 B6        0076         DC    X'B6'         * 8  " "
               0077 *******************************************
               0078 ****************************
    = 0039    0079         ORG   X'39'              * GET STOP AM BIT
0039 F7        0080 STP_AM  LI    B'0111'
003A 14        0081         0
003B 07        0082         SC
003C 08        0083         ROL
003D 08        0084         ROL
003E A7A1      0085         JMP   XY_TO_06
               0086 ***********************************
               0087 ******************************
    = 0040    0088         ORG   X'40'              * IR OUT ROUTINE
0040 E8        0089 TABLE   DC    256-24
0041 34        0090         DC    256-204
0042 02        0091         DC    256-254
0043 02        0092         DC    256-254
0044 E8        0093         DC    256-24
0045 34        0094         DC    256-204
               0095 **********
0046 F3        0096 IROUT   LI    X'3'
0047 6B4A      0097         JNC   IROUT2
0049 F0        0098         LI    X'0'
004A 54        0099 IROUT2  STX
004B 9061      0100         CALL  TWTY_OUT
004D 9055      0101         CALL  IDLE
004F 9061      0102         CALL  TWTY_OUT
0051 9055      0103         CALL  IDLE
0053 9061      0104 IRST    CALL  TWTY_OUT
0055 7640      0105 IDLE    LEAI  TABLE
0057 44        0106         LY
0058 6E        0107         RDTBL
0059 59        0108 IDLE2   ICEA
005A 5A        0109         ICEA
005B 59        0110         ICEA
005C 6859      0111         JNC   IDLE2
005E 3201      0112         LMXI  X'0',1
0060 34        0113         RET
0061 76C7      0114 TWTY_OUT      LEAI  X'C7'
0063 720F      0115 REP     OUT   0,X'F'
0065 00        0116         NOP
0066 00        0117         NOP
0067 00        0118         NOP
0068 7205      0119         OUT   0,X'5'
006A 00        0120         NOP
006B 5F63      0121         ICEJ  REP
006D 720F      0122 REP2    OUT   0,X'F'
006F 00        0123         NOP
0070 00        0124         NOP
0071 00        0125         NOP
```

```
0072 720B        0126            OUT       0,X'B'
0074 00          0127            NOP
0075 5F6D        0128            ICEJ      REP2
0077 34          0129            RET
                 0130 ****************************
                 0131 *
    = 0078       0132            ORG       X'78'              * ONE SHOT CHECK
0078 1FDB        0133 LD_SET     LD        X'DB'
007A 3FDB        0134            SBMD      3,X'DB'
007C 34          0135            RET
                 0136 ****************************************
    = 0080       0137            ORG       X'80'              * P_DECODE
    = 0080       0138 P_DECODE   EQU       *
0080 7631        0139            LEAI      X'31'
0082 1FE2        0140            LD        X'E2'
0084 0B          0141            RDTBL
0085 49E0        0142            STBD      X'E0'
0087 34          0143            RET
                 0144 ************************
                 0145 *
    = 0088       0146            ORG       X'88'              * STORE 4
    = 0088       0147 STORE4     EQU       *
0088 8B          0148            CALS      LB_E0_ST
0089 91DE        0149            CALL      IC_STB_3
008B FD          0150            LI        B'1101'
008C A328        0151            JMP       DST_JMP
                 0152 **********************************************
                 0153 ****************************
    = 008F       0154            ORG       X'8F'              * ICE_ST ICXY
008F 5C          0155 ICXY       LXY
0090 59          0156 ICE_ST     ICEA
0091 5D          0157            STXY
0092 17          0158            L
0093 34          0159            RET
                 0160 ****************************
    = 0094       0161            ORG       X'94'              * IC_STX'S
0094 59          0162 IC_ST_10   ICEA
0095 59          0163 IC_STX_9   ICEA
0096 59          0164 IC_STX_8   ICEA
0097 59          0165 IC_STX_7   ICEA
0098 59          0166 IC_STX_6   ICEA
0099 59          0167 IC_STX_5   ICEA
009A 59          0168 IC_STX_4   ICEA
009B 59          0169 IC_STX_3   ICEA
009C 59          0170 IC_STX_2   ICEA
009D 59          0171            ICEA
009E 5D          0172            STXY
009F 34          0173            RET
                 0174 ****************************
    = 00A0       0175            ORG       X'A0'              * P_NUM_ON
    = 00A0       0176 P_NUM_ON   EQU       *
00A0 7620        0177            LEAI      X'20'
00A2 1FE2        0178            LD        X'E2'
```

```
00A4 0E      0179            RDTEL
00A5 36      0180            JMPEH
00A6 F2      0181 PROG_4  LI    2           * SET PROG 4
00A7 F4      0182 PROG_2  LI    4           * SET PROG 2
00A8 F8      0183 PROG_1  LI    8           * SET PROG 1
00A9 F1      0184 PROG_3  LI    1           * SET PROG 3
00AA 1CD5    0185            OD    X'D5'
00AC 53D5    0186            STD   X'D5'
00AE 34      0187            RET
             0188 *********************************
      = 00B0 0189            ORG   X'0B0'      * LB_E0_ST
00B0 4SE0    0190 LB_E0_ST    LBD   X'E0'
00B2 5D      0191            STXY
00B3 34      0192            RET
             0193 ***************************************
             0194 ****************************
      = 00B4 0195            ORG   X'0B4'      * DAY SETS
      = 00B4 0196 ITS_TUE EQU   *
00B4 3DD1    0197            SBMD  1,X'D1'     * SET TUE
00B6 34      0198            RET
00B7 3CCA    0199 ITS_FRI SBMD   0,X'CA'       * SET FRI
00B9 34      0200            RET
      = 00BA 0201 ITS_THU EQU   *
00BA 3CCC    0202            SBMD  0,X'CC'     * SET THU
00BC 34      0203            RET
      = 00BD 0204 ITS_SAT EQU   *
00BD 3DCA    0205            SBMD  1,X'CA'     * SET SAT
00BF 34      0206            RET
             0207 ****************************
      = 00C0 0208            ORG   X'C0'       * PUT_CHNL
00C0 9019    0209 PUT_CHNL     CALL   NTR_WAIT
00C2 F2      0210            LI    X'2'
00C3 53C9    0211            STD   X'C9'
00C5 9019    0212            CALL  FULL
00C7 F2      0213            LI    X'2'
00C8 53C9    0214 LST_FLT  STD   X'C9'
00CA 9029    0215            CALL  HOLD_14
00CC 34      0216            RET
             0217 *******************************
      = 00CD 0218            ORG   X'0CD'      * DAY SET
00CD 3CD2    0219 ITS_SUN SBMD  0,X'D2'       * SET SUN
00CF 34      0220            RET
             0221 ***************************************
      = 00D0 0222            ORG   X'0D0'      * STR_CHK
      = 00D0 0223 STR_CHK EQU   *
00D0 F7      0224            LI    X'7'
00D1 1ED9    0225            ND    X'D9'
00D3 53E6    0226            STD   X'E6'
00D5 34      0227            RET
             0228 *********************************
      = 00D6 0229            ORG   X'0D6'      * P_NUM_ON'S
00D6 F1      0230 PROG_6  LI    1           * SET PROG 6
00D7 F2      0231 PROG_5  LI    2           * SET PROG 5
```

```
00D8 F4      0232 PROG_7  LI    4           * SET PROG 7
00D9 F8      0233 PROG_8  LI    8           * SET PROG 8
00DA 1ED4    0234        OD     X'D4'
00DC 5DD4    0235        STD    X'D4'
00DE 34      0236        RET
             0237 ***********************
    = 00E0   0238        ORG    X'E0'        * DAY_OFF
    = 00E0   0239 DAY_OFF EQU   *
00E0 37CA    0240        RMI    X'CA'        * RESET FRI SAT CABLE A B
00E2 38D2    0241        RBMD   0,X'D2'      * RESET SUN
00E4 38D1    0242        RBMD   0,X'D1'      * RESET MON
00E6 39D1    0243        RBMD   1,X'D1'      * RESET TUE
00E8 38D0    0244        RBMD   0,X'D0'      * RESET WED
00EA 38CC    0245        RBMD   0,X'CC'      * RESET THU
00EC 38D3    0246        RBMD   0,X'D3'      * RESET FIRST
00EE A1E9    0247        JMP    D_F_CNT
             0248 ***********************
    = 00F0   0249        ORG    X'0F0'       * DAY_ON
    = 00F0   0250 DAY_ON  EQU   *
00F0 8B      0251        CALS   LB_E0_ST
00F1 7617    0252        LEAI   X'17'
00F3 16      0253        N                   * A=DAY
00F4 3E      0254        RDTBL
00F5 36      0255        JMPEA
             0256 *************
00F6 3CD0    0257 ITS_WED SBMD  0,X'D0'      * SET WED
00F8 34      0258 NOT_HERE RET
00F9 3CD1    0259 ITS_MON SBMD  0,X'D1'      * SET MON
00FB 34      0260        RET
             0261 ****************************
    = 0100   0262        ORG    X'100'       * DISPLAY
0100 29      0263        DC     DISP_0
0101 31      0264        DC     DISP_1
0102 36      0265        DC     DISP_2
0103 3E      0266        DC     DISP_3
0104 54      0267        DC     DISP_4
0105 68      0268        DC     DISP_5
0106 66      0269        DC     DISP_6
0107 84      0270        DC     DISP_7
0108 88      0271        DC     DISP_8
0109 8E      0272        DC     DISP_9
010A 92      0273        DC     DISP_10
010B 98      0274        DC     DISP_11
010C 96      0275        DC     DISP_12
010D A7      0276        DC     DISP_13
010E A5      0277        DC     DISP_14
010F 44      0278        DC     DISP_15
0110 38D6    0279 DISP_DCD RBMD  0,X'D6'
0112 1FE3    0280        LD     X'E3'
0114 E4      0281        CI     X'4'
0115 6A23    0282        JNZ    DO_IT
0117 1FDC    0283        LD     X'DC'
0119 791D    0284        JBZ    1,CJ
```

```
011B 3CD6      0285         SBMD    6,X'D6'
011D 1FD9      0286 CJ      LD      X'D9'
011F 7F23      0287         JBNZ    3,DO_IT
0121 A44E      0288         JMP     ONWARD
               0289 ***********************
0123 7660      0290 DO_IT   LEAI    X'60'
0125 1FE3      0291         LD      X'E3'
0127 03        0292         RDTBL
0129 36        0293         JMPER
               0294 ***********************
     = 0129    0295 DISP_0  EQU     *
0129 9490      0296         CALL    CLK_FLSH            * FLASH CLOCK
012B 8E        0297         CALS    DAY_OFF
012C 7E2F      0298         JBZ     3,OFF               * FLASH DAY
012E 8F        0299 LOAD    CALS    DAY_ON
012F A428      0300 OFF     JMP     DSP_LOAD
               0301 ***********************
               0302 *
     = 0131    0303 DISP_1  EQU     *
0131 9490      0304         CALL    CLK_FLSH            * FLASH CLOCK
0133 8E        0305         CALS    DAY_OFF
0134 A12E      0306         JMP     LOAD
               0307 ***********************
               0308 *
     = 0136    0309 DISP_2  EQU     *
0136 9490      0310         CALL    CLK_FLSH
0138 7F40      0311         JBNZ    3,STHR_ON
013A 92DE      0312         CALL    HR_OFF
013C A428      0313         JMP     DSP_LOAD
               0314 ***********************
               0315 *
     = 013E    0316 DISP_3  EQU     *
013E 9490      0317         CALL    CLK_FLSH
0140 9475      0318 STHR_ON CALL    STOFAMDS
0142 A1B4      0319         JMP     HR_ON
               0320 ***********************
0144 92F4      0321 DISP_15 CALL    P_NUM_OF   *
0146 1FD7      0322         LD      X'D7'
0148 7B54      0323         JBZ     3,DISP_4
014A 77E2      0324         LXYI    X'E2'
014C 1F07      0325         LD      X'07'
014E 57        0326         ST
014F 8A        0327         CALS    P_NUM_ON
0150 1F06      0328         LD      X'06'
0152 57        0329         ST
0153 8A        0330         CALS    P_NUM_ON
               0331 ***********************
     = 0154    0332 DISP_4  EQU     *
0154 3DD6      0333 GO_D4   SBMD    1,X'D6'             * CLOCK ON
0156 3CCE      0334         SBMD    0,X'CE'             * SET COLON
0158 3BD3      0335         REMD    3,X'D3'             * RESET STOP
015A 3AD3      0336         REMD    2,X'D3'             * RESET START
015C 8E        0337         CALS    DAY_OFF
```

```
0150 8F         0338          CALS    DAY_ON
015E 76C4       0339          LEAI    X'C4'
0160 9476       0340          CALL    STP_4
0162 77C1       0341          LXYI    X'C1'
0164 A177       0342          JMP     XY_FIX
                0343  ***********************************
0166 3FD7       0344  DISP_6  SBMD    3,X'D7'
                0345  ***********************************
     = 0168     0346  DISP_5  EQU     *
0168 9488       0347          CALL    STRTDG_L
016A 3ED3       0348          SBMD    2,X'D3'        * SET START
016C 39D6       0349          RBMD    1,X'D6'        * RESET CLOCK
016E 92F4       0350          CALL    P_NUM_OF
0170 8E         0351          CALS    DAY_OFF
0171 7B74       0352          JBZ     3,RIGHT
0173 8A         0353          CALS    P_NUM_ON
0174 8F         0354  RIGHT   CALS    DAY_ON
0175 9458       0355          CALL    P_DAY_ON
0177 5C         0356  XY_FIX  LXY
0178 919E       0357          CALL    IC_STB_3
017A A1B4       0358          JMP     HR_ON
017C 8B         0359  P_DSP   CALS    LB_E0_ST
017D 5A         0360          DCEA
017E 5A         0361          DCEA
017F 5A         0362          DCEA
0180 49E0       0363          STBD    X'E0'
0182 A428       0364          JMP     DSP_LOAD
                0365  ***********************************
0184 8A         0366  DISP_7  CALS    P_NUM_ON
0185 8E         0367          CALS    DAY_OFF
0186 7B2F       0368          JBZ     3,OFF
                0369  ***********************************
0188 8E         0370  DISP_8  CALS    DAY_OFF
0189 8F         0371  DAYS_LIT CALS   DAY_ON
018A 9458       0372          CALL    P_DAY_ON
018C A428       0373          JMP     DSP_LOAD
                0374  ***********************************
018E 92DE       0375  DISP_9  CALL    HR_OFF
0190 7B2F       0376          JBZ     3,OFF
                0377  ***********************************
0192 9488       0378  DISP_10 CALL    STRTDG
0194 A1B4       0379          JMP     HR_ON
                0380  ***********************************
0196 3FD7       0381  DISP_12 SBMD    3,X'D7'
0198 92DE       0382  DISP_11 CALL    HR_OFF
019A 38CE       0383          RBMD    0,X'CE'        * RESET COLON
019C 3AD3       0384          RBMD    2,X'D3'        * RESET START
019E 3DD2       0385          SBMD    1,X'D2'        * SET CHANNEL
01A0 8E         0386          CALS    DAY_OFF
01A1 7B2F       0387          JBZ     3,OFF
01A3 A499       0388          JMP     CHAN_ON
                0389  *
                0390  ***********************************
```

```
01A5 3FD7     0391 DISP_14  SBMD   3,X'D7'
01A7 39D2     0392 DISP_13  RBMD   1,X'D2'         * RESET CHANNEL
01A9 3CCE     0393         SBMD   0,X'CE'          * SET COLON
01AB 3FD3     0394         SBMD   3,X'D3'          * SET STOP
01AD 8E       0395         CALS   DAY_OFF          * CLEAR A AND B
01AE 92DE     0396         CALL   HR_OFF
01B0 7E2F     0397         JEZ    3,OFF
01B2 A1A0     0398         JMP    STHR_ON
              0399 ********************************
      = 01B4  0400 HR_ON   EQU    *                HR ON
01B4 93EE     0401         CALL   ONE_TEN
01B6 76CF     0402         LEAI   X'CF'
01B8 49E6     0403         STED   X'E6'            * DSP REG AT CF
01BA 8B       0404         CALS   LB_E0_ST
              0405 *                                * XY POINTS TO HOUR
01BB 5A       0406         ICEA
01BC 5A       0407         ICEA
01BD 5D       0408         STXY
01BE F3       0409         LI     X'3'
01BF 10       0410         A
01C0 ED       0411         CI     X'D'
01C1 6FD7     0412         JC     NO_HALF          * JMP IF HOUR LESS THAN 10
01C3 FC       0413         LI     X'C'
01C4 1CD1     0414         OD     X'D1'            * SETTING HALF DIGIT
      = 01C6  0415 GOT_IT  EQU    *
01C6 53D1     0416         STD    X'D1'            * STORE HALF DIGIT
01C8 94DF     0417         CALL   NUM_DSP          * XY STILL AT HOUR
01CA 1FE3     0418         LD     X'E3'
01CC EF       0419         CI     X'F'
01CD 6E7C     0420         JZ     P_DSP
01CF E4       0421         CI     X'4'
01D0 6FD5     0422         JC     HR_DONE
01D2 E7       0423         CI     X'7'
01D3 6F7C     0424         JC     P_DSP
01D5 A426     0425 HR_DONE JMP    DSP_LOAD
      = 01D7  0426 NO_HALF EQU    *
01D7 F3       0427         LI     X'3'
01D8 1ED1     0428         ND     X'D1'
01DA A1C6     0429         JMP    GOT_IT
              0430 ********************************
01DC 59       0431 IC_STB_5       ICEA
01DD 59       0432         ICEA
01DE 59       0433 IC_STB_3       ICEA
01DF 59       0434 IC_STB_2       ICEA
01E0 59       0435         ICEA
01E1 49E0     0436         STBD   X'E0'
01E3 34       0437         RET
              0438 ****************************
01E4 76C1     0439 ST57C   LEAI   X'C1'
01E6 49E0     0440 ST57CC  STBD   X'E0'
01E8 34       0441         RET
              0442 ****************************
              0443 *                                * DAY OFF CONT
```

```
01E9 39D3          0444 D_F_CNT REMD    1,X'D3'              * RESET SECOND
01EB 1FD7          0445         LI      X'D7'
01ED 34            0446         RET
                   0447 *******************************
01EE 9018          0448 PUT_CHNH        CALL    NTR_WAIT
01F0 F3            0449         LI      X'3'
01F1 53C9          0450         STD     X'C9'
01F3 9019          0451         CALL    FULL
01F5 F3            0452         LI      X'3'
01F6 A0C9          0453         JMP     LST_PUT
                   0454 **********************************
     = 01F8        0455 STF_AM_T        EQU     *
01F8 8E            0456         CALS    LB_E0_ST
01F9 20            0457         ICY
01FA F8            0458         LI      X'8'
01FB 15            0459 X_JMP   X
01FC 57            0460 ST_JMP  ST
01FD A116          0461 D_JMP   JMP     DISP_DCD
                   0462 ***********************************
     = 0200        0463         ORG     X'200'               * KEY DECODE
0200 98            0464         DC      SL_UP_PR             *0000 0000
0201 35            0465         DC      CH_DOWN              *0000 0001
0202 35            0466         DC      VOL_DOWN             *0000 0010
0203 8C            0467         DC      SL_DN_PR             *0000 0011
0204 81            0468         DC      CLEAR_PF             *0000 0100
0205 75            0469         DC      CK_ST_FR             *0000 0101
0206 40            0470         DC      DONE_DCD             *0000 0110
0207 40            0471         DC      DONE_DCD             *0000 0111
0208 32            0472         DC      DATA_NTR             *0000 1000
0209 35            0473         DC      CH_UP                *0000 1001
020A 35            0474         DC      VOL_UP               *0000 1010
020B 35            0475         DC      MUTE                 *0000 1011
020C 6B            0476         DC      PROG_S_P             *0000 1100
020D 31            0477         DC      CLR_NTRY             *0000 1101
020E 35            0478         DC      POWER                *0000 1110
020F BA            0479         DC      AB_PREP              *0000 1111
0210 42            0480         DC      ZERO_PRP             *0001 0000
0211 42            0481         DC      ONE_PREP             *0001 0001
0212 42            0482         DC      TWO_PREP             *0001 0010
0213 42            0483         DC      THRE_PRP             *0001 0011
0214 42            0484         DC      FOUR_PRP             *0001 0100
0215 42            0485         DC      FIVE_PRP             *0001 0101
0216 42            0486         DC      SIX_PREP             *0001 0110
0217 42            0487         DC      SEVN_PRP             *0001 0111
0218 42            0488         DC      EIGHT_PR             *0001 1000
0219 42            0489         DC      NINE_PRP             *0001 1001
021A 35            0490         DC      PC                   *0001 1010
021B 8A            0491         DC      STR_PREP             *0001 1011
021C 35            0492         DC      ENTER                *0001 1100
021D 2E            0493         DC      FC                   *0001 1101
021E 40            0494         DC      DONE_DCD             *0001 1110
021F 40            0495         DC      DONE_DCD             *0001 1111    CODE FOR NO KEY NO USE
     = 0220        0496 KEY_DEC EQU     *
```

```
0220 77DB     0497          LXYI    X'DB'
0222 17       0498          L
0223 7A40     0499          JBZ     2,DONE_DCD          * CHECK KEY READY
0225 3ADB     0500          REMD    2,X'DB'             * RESET KEY READY
0227 F1       0501          LI      X'1'
0228 16       0502          N
0229 56       0503          STE                         * STORE HI BYTE IN E
022A 24       0504          ICY                         * XY TO LOW BYTE
022B 17       0505          L
022C 0B       0506          RDTBL
022D 36       0507          JMPEA
              0508 ***************************************************
    = 022E    0509 FC       EQU     *
022E 3BDB     0510          REMD    0,X'DB'
0230 F0       0511          LI      X'0'
    = 0231    0512 CLR_NTRY EQU     *
0231 F3       0513          LI      X'3'
    = 0232    0514 DATA_NTR EQU     *
0232 FC       0515          LI      X'C'
0233 53DA     0516          STD     X'DA'
              0517 *
    = 0235    0518 CH_DOWN  EQU     *
              0519 *
    = 0235    0520 VOL_DOWN EQU     *
              0521 *
    = 0235    0522 CH_UP    EQU     *
              0523 *
    = 0235    0524 VOL_UP   EQU     *
              0525 *
    = 0235    0526 MUTE     EQU     *
              0527 *
    = 0235    0528 POWER    EQU     *
              0529 *
    = 0235    0530 PC       EQU     *
              0531 *
    = 0235    0532 ENTER    EQU     *
              0533 ********************
              0534 *
0235 77C8     0535 COM_OUT  LXYI    X'C8'
0237 1FDA     0536          LD      X'DA'
0239 22       0537          STICY                       * STORE LOW BYTE
023A F1       0538          LI      X'1'
023B 1EDF     0539          ND      X'DF'
023D D2       0540          AI      X'2'
023E 14       0541          O
023F 57       0542          ST
0240 A110     0543 DONE_DCD JMP     DISP_DCD
              0544 ***********************
    = 0242    0545 ZERO_PRP EQU     *
              0546 ******
    = 0242    0547 ONE_PREP EQU     *
              0548 ******
    = 0242    0549 TWO_PREP EQU     *
```

```
                0550 ******
      = 0242    0551 THRE_PRP        EQU     *
                0552 ******
      = 0242    0553 FOUR_PRP        EQU     *
                0554 ******
      = 0242    0555 FIVE_PRP        EQU     *
                0556 ******
      = 0242    0557 SIX_PREP        EQU     *
                0558 ******
      = 0242    0559 SEVN_PRP        EQU     *
                0560 ******
      = 0242    0561 EIGHT_PR        EQU     *
                0562 ******
      = 0242    0563 NINE_PRP        EQU     *
                0564 ******
                0565 ******
      = 0242    0566 NUM_CHK EQU     *
0242 1FDA       0567         LD      X'DA'
0244 53E7       0568         STD     X'E7'           * STORE NUMBER IN E7
0246 8D         0569         CALS    STR_CHK         * GET STORE NUMBER
0247 E0         0570         CI      X'0'
0248 6E35       0571         JZ      COM_OUT
024A 9078       0572         CALL    LD_SET
024C 7F40       0573         JBNZ    3,DONE_DCD      * CHECK ONE SHOT
024E 8D         0574         CALS    STR_CHK
024F E3         0575         CI      X'3'
0250 6A55       0576         JNZ     TRY_ST4
0252 FA         0577         LI      X'A'
0253 A267       0578         JMP     DCLD_JMP
0255 E4         0579 TRY_ST4 CI      X'4'
0256 6A5D       0580         JNZ     TRY_ST5
0258 FC         0581         LI      X'C'
0259 53E3       0582         STD     X'E3'
025B A5B7       0583         JMP     CHAN_NTR
025D E5         0584 TRY_ST5 CI      X'5'
025E 6A63       0585         JNZ     TRY_ST7
0260 FE         0586         LI      X'E'
0261 A267       0587         JMP     DCLD_JMP
0263 E7         0588 TRY_ST7 CI      X'7'
0264 6A40       0589         JNZ     DONE_DCD
0266 F3         0590         LI      X'3'
0267 53E3       0591 DCLD_JMP        STD     X'E3'
0269 A7A4       0592         JMP     ROTATE
                0593 ******************************
      = 026B    0594 PROG_S_P        EQU     *
026B 1FD1       0595         LD      X'D1'
026D 7E40       0596         JBZ     3,DONE_DCD
026F 9078       0597         CALL    LD_SET
0271 7F40       0598         JBNZ    3,DONE_DCD
0273 A5??       0599         JMP     PROG_SET
                0600 ******************************
      = 0275    0601 CK_ST_PR        EQU     *
0275 1FD8       0602         LD      X'D8'
```

```
0277 7840      0603        JBZ    0,DONE_DCD
0279 8D        0604        CALS   STR_CHK
027A E0        0605        CI     X'0'
027B 6A40      0606        JNZ    DONE_DCD
027D 37E3      0607        RMD    X'E3'
027F A5A9      0608        JMF    CLK_SET
               0609 *******************************
      = 0281   0610 CLEAR_PP     EQU    *
0281 8D        0611        CALS   STR_CHK
0282 E1        0612        CI     X'1'
0283 6A40      0613        JNZ    DONE_DCD
0285 F4        0614        LI     X'4'
0286 53E3      0615        STD    X'E3'
0288 A7C0      0616        JMF    CLEAR
               0617 *************************
028A A365      0618 STR_PREP     JMP    ST_EXAM
               0619 *****************************
028C 3ED6      0620 SL_DN_PR     RBMD   3,X'D6'
028E A29A      0621        JMP    SEL_DECD
               0622 **************************
      = 0290   0623        ORG    X'290'           * KEY DECODE CONT
0290 40        0624        DC     DONE_DCD
0291 A5        0625        DC     P_NUM
0292 A9        0626        DC     STRT_D
0293 AD        0627        DC     ST_APM
0294 40        0628        DC     DONE_DCD
0295 B1        0629        DC     STPAPST
0296 B6        0630        DC     CK_DY
0297 B2        0631        DC     CK_AM
               0632 ********************************
      = 0298   0633 SL_UP_FR     EQU    *
0298 3FD6      0634        SBMD   3,X'D6'
029A 9078      0635 SEL_DECD    CALL   LD_SET
029C 7F40      0636        JBNZ   3,DONE_DCD
029E 7690      0637        LEAI   X'90'
02A0 77E3      0638        LXYI   X'E3'
02A2 8D        0639        CALS   STR_CHK
02A3 0B        0640        RDTBL
02A4 36        0641        JMPEA
               0642 ******************************
02A5 F6        0643 P_NUM   LI     X'6'
02A6 57        0644        ST
02A7 A54E      0645        JMF    P_SEL_UP
02A9 F8        0646 STRT_D  LI     X'8'
02AA 57        0647        ST
02AB A56E      0648        JMF    D_ST_INC
02AD FA        0649 ST_APM  LI     X'A'
02AE 57        0650        ST
02AF A5AE      0651        JMF    ST_AM_TG
02B1 FE        0652 STPAPST LI     X'E'
02B2 F3        0653 CK_AM   LI     X'3'
02B3 57        0654 A_F_JMP ST
02B4 A1F5      0655        JMP    STP_AM_T
```

```
02B6 F1         0656 CK_D7    LI      X'1'
02B7 57         0657         ST
02B8 657A       0658         JMP     CK_D_INC
                0659 ****************************
      = 02BA    0660 AE_PREP  EQU     *
02BA 8D         0661         CALS    STR_CHK
02BB E4         0662         CI      X'4'
02BC 6A35       0663         JNZ     COM_OUT
02BE 9078       0664         CALL    LD_SET
02C0 7F40       0665         JBNZ    3,DONE_DCD
02C2 FC         0666         LI      X'C'
02C3 53E3       0667         STD     X'E3'
02C5 A600       0668         JMP     A_P
                0669 ********************
                0670 *
02C7 8B         0671 SMRT_ASS CALS   LB_E0_ST
02C8 5A         0672         ICEA
02C9 5D         0673         STXY
02CA F5         0674         LI      X'5'
02CB 0F         0675         C
02CC 6FDA       0676         JC      NO_NO
02CE 5C         0677         LXY
02CF 5A         0678         ICEA
02D0 5D         0679         STXY
02D1 F0         0680         LI      X'0'
02D2 0F         0681         C
02D3 6EDA       0682         JZ      NO_NO
02D5 FD         0683         LI      X'D'
02D6 0F         0684         C
02D7 6FDA       0685         JC      NO_NO
02D9 F0         0686         LI      X'0'
02DA F1         0687 NO_NO   LI      X'1'
02DB 77E3       0688         LXYI    X'E3'
02DD 34         0689         RET
                0690 *******************************
                0691 *
      = 02DE    0692 HR_OFF   EQU     *            * HR OFF DISPLAY
02DE 77CB       0693         LXYI    X'CB'
02E0 F0         0694 CLEAR_OT LI     X'0'
02E1 22         0695         STICY
02E2 F1         0696         LI      X'1'
02E3 16         0697         N
02E4 22         0698         STICY
02E5 BFE0       0699         CYIJ    X'F',CLEAR_OT
02E7 F0         0700         LI      X'0'
02E8 57         0701         ST
02E9 77D0       0702         LXYI    X'D0'
02EB F1         0703         LI      X'1'
02EC F3         0704 AND_3   LI      X'3'
02ED 16         0705         N
02EE 22         0706         STICY
02EF B3EC       0707         CYIJ    3,AND_3
02F1 1FD7       0708         LD      X'D7'
```

```
02F3 34            0709          RET
                   0710 **********************************
     = 02F4        0711 F_NUM_OF     EQU     *
02F4 37D4          0712          RMD     X'D4'
02F6 37D5          0713          RMD     X'D5'
02F8 34            0714          RET
                   0715 **********************************
     = 0300        0716          ORG     X'300'
0300 46            0717          DC      DONE_DCD
0301 25            0718          DC      ST_1_JMP
0302 17            0719          DC      ST_2_JMP
0303 2C            0720          DC      ST_3_JMP
0304 13            0721          DC      ST_4_JMP
0305 3C            0722          DC      ST_5_JMP
0306 38            0723          DC      ST_6_JMP
0307 46            0724          DC      ST_7_JMP
                   0725 **********************************
     = 0308        0726 ST_EXAM EQU     *
0308 9078          0727          CALL    LD_SET
030A 7F23          0728          JBNZ    3,DONE_DCD
030C 77E3          0729          LXYI    X'E3'
030E 7600          0730          LEAI    X'00'
0310 8D            0731          CALS    STR_CHK
0311 0B            0732          RDTBL
0312 36            0733          JMPEA
                   0734 **********************************
0313 FD            0735 ST_4_JMP     LI      X'D'
0314 57            0736          ST
0315 A033          0737          JMP     STORE4
                   0738 ********************
0317 F9            0739 ST_2_JMP     LI      X'9'
0318 57            0740          ST
     = 0319        0741 STORE2  EQU     *
0319 9458          0742          CALL    P_DAY_ON
031B FB            0743          LI      B'1011'
031C FF            0744 STORE6  LI      X'F'
031D 53D9          0745 ST2_STUF     STD     X'D9'          * STORE STORE COUNT
031F 8F            0746          CALS    DAY_ON
0320 8B            0747          CALS    LB_EO_ST                       *
0321 91DE          0748          CALL    IC_STB_3
0323 A116          0749 DONE_DCD     JMP     DISF_DCD
                   0750 ***.***********
0325 F7            0751 ST_1_JMP     LI      X'7'
0326 57            0752          ST
     = 0327        0753 STORE1  EQU     *
0327 FA            0754          LI      B'1010'
0328 53D9          0755 IST_JMP STD     X'D9'
032A A116          0756          JMP     DISF_DCD
                   0757 **********************************
032C 92C7          0758 ST_3_JMP     CALL    SMRT_ASS
032E 7C23          0759          JBNZ    0,DONE_DCD
0330 FB            0760          LI      X'B'
0331 57            0761          ST
```

```
         = 0332      0762 STORE3   EQU     *
0332 8B              0763         CALS     LE_E0_ST
0333 91DF            0764         CALL     IC_STB_2
0335 FC              0765         LI       B'1100'
0336 A326            0766         JMP      DST_JMP
                     0767 ****************************
0338 F2              0768 ST_6_JMP         LI      X'2'
0339 57              0769         ST
033A A31C            0770         JMP      STORE6
                     0771 ************************
033C 92C7            0772 ST_5_JMP         CALL    SMRT_ASS
033E 7C23            0773         JENZ     0,DONE_DCD
0340 F4              0774         LI       X'4'
0341 57              0775         ST
         = 0342      0776 STORE5   EQU     *
0342 3C16            0777         SBMD     0,X'D6'              * SET CLOCK MODE
0344 A7C3            0778         JMP      OVR_BGN
                     0779 ****************
0346 92C7            0780 ST_7_JMP         CALL    SMRT_ASS
0348 7C23            0781         JENZ     0,DONE_DCD
034A F4              0782         LI       X'4'
034B 57              0783         ST
         = 034C      0784 STORE7   EQU     *
034C 94FB            0785         CALL     ST_57
034E 3FC1            0786         SBMD     3,X'C1'
0350 A110            0787         JMP      DISP_DCD
                     0788 **************************
                     0789 ******************************
0352 1FD9            0790 COMP_BGN         LD      X'D9'
0354 7BE6            0791         JBZ      3,COM_DONE           * COMP WHEN CHANGE
0356 1FDB            0792         LD       X'DB'
0358 7EE6            0793         JENZ     2,COM_DONE           * COMP ONLY IF NO KEY
035A 3BD9            0794         RBMD     3,X'D9'
035C 1FE3            0795         LD       X'E3'
035E E4              0796         CI       X'4'
035F 6AE6            0797         JNZ      COM_DONE             * COMP ONLY IN CLOCK MODE
0361 1FDC            0798         LD       X'DC'
0363 7D6C            0799         JENZ     1,CAN_COMP           * COMP ONLY IF TIMER ON
0365 F1              0800         LI       X'1'
0366 53C0            0801         STD      X'C0'
0368 38D7            0802         RBMD     0,X'D7'
036A A3E2            0803         JMP      RST_ACT
                     0804 CAN_COMP
036C 1FC1            0805         LD       X'C1'
036E 7BE6            0806         JBZ      3,COM_DONE           * COMP ONLY IF CLOCK RUN
0370 1FDF            0807         LD       X'DF'
0372 E0              0808         CI       X'0'
0373 6AC3            0809         JNZ      ONE_ON               * JMP IF ONE ACTIVE
0375 61DF            0810 TRY_NEXT         ICMD    X'DF'        * INC ACTIVE COUNT
0377 1FDF            0811         LD       X'DF'
0379 E9              0812         CI       X'9'
037A 6EE2            0813         JZ       RST_ACT
037C 53E2            0814         STD      X'E2'
```

```
037E F7          0815        LI      X'7'
037F 1CC0        0816        OD      X'C0'           * GET MSB OF COMP DAY
0381 1EC1        0817        ND      X'C1'           * GET DAY
0383 5307        0818        STD     X'07'
0385 974C        0819        CALL    DAY_C
0387 E2          0820        CI      X'2'            * COMPARE TO START DAY
0388 6A75        0821        JNZ     TRY_NEXT
                 0822 *
                 0823 * GETTING TO HERE MEANS START DAY MATCH
                 0824 *
038A 77C2        0825 DA_OK  LXYI    X'C2'           * XY TO START HOUR
038C 960B        0826        CALL    PUT_COM         * PUT HM IN COMP RAM
038E 20          0827        ICY
038F 9039        0828        CALL    STR_AM
0391 57          0829        ST                      * PUT AM IN COMP RAM
0392 975B        0830        CALL    STRT_HMC
0394 E2          0831        CI      X'2'
0395 6A75        0832        JNZ     TRY_NEXT        *(A)=2 MEANS MATCH
0397 5C          0833        LXY
0398 55          0834        ICEA
0399 49E4        0835        STED    X'E4'           * STORE XY AT CHAN TEN IN E4
039B FE          0836        LI      X'E'
039C 8C          0837        CALS    PUT_CHNL        * TURN ON REG BCY
039D F8          0838        LI      X'8'
039E 8C          0839        CALS    PUT_CHNL        * ON COMMAND
039F 5C          0840        LXY
03A0 9098        0841        CALL    IC_STX_6
03A2 17          0842        L
03A3 78B0        0843        JBZ     0,PUT_TEN       * JMP IF A CABLE OR NO HUN
03A5 1FDC        0844        LD      X'DC'
03A7 78AD        0845        JBZ     0,OUT_HUN       * JMP IF HUNDRED BOX
03A9 FF          0846        LI      X'F'
03AA 8C          0847        CALS    PUT_CHNL        * TOGGLE A/B
03AB A3B0        0848        JMP     PUT_TEN
03AD F1          0849 OUT_HUN LI     X'1'
03AE 91EE        0850        CALL    PUT_CHNH        * OUT THE HUNDRED BIT
03B0 48E4        0851 PUT_TEN LED    X'E4'
03B2 5D          0852        STXY                    * XY TO CHAN TEN
03B3 21          0853        LICY
03B4 EA          0854        CI      X'A'
03B5 6BB9        0855        JNC     PTONE
03B7 91EE        0856        CALL    PUT_CHNH        * OUT TENS
03B9 17          0857 PTONE  L
03BA 91EE        0858        CALL    PUT_CHNH        * OUT ONES
03BC FC          0859        LI      X'C'
03BD 91EE        0860        CALL    PUT_CHNH        * OUT ENTER
03BF 3CD7        0861        SBMD    0,X'D7'         * SET FIRST PROG HIR
03C1 A3E4        0862        JMP     C_DONE          * DONE HERE
                 0863 *************************
                 0864 *************************
03C3 53E2        0865 ONE_ON STD     X'E2'
03C5 77C2        0866        LXYI    X'C2'
03C7 960B        0867        CALL    PUT_COM         * PUT TIME HM IN COMP RAM
```

```
03C9 20         0868            ICY
03CA 9037       0869            CALL    STP_AM
03CC 57         0870            ST                              * PUT TIME AM IN COMP RAM
03CD 978E       0871            CALL    STP_HMC                 * XY POINT TO STOP HOUR
03CF E2         0872            CI      X'2'
03D0 6AE4       0873            JNZ     C_DONE          * JMP IF NO MATCH
                0874 *                                  * HMC PUTS XY TO STOP MIN ONE
03D2 20         0875            ICY                             * XY TO PROG INFO
03D3 17         0876            L
03D4 78DC       0877            JEZ     0,TURN_OFF      * JMP IF AT CABLE A
03D6 1FDC       0878            LD      X'DC'
03D8 78DC       0879            JEZ     0,TURN_OFF
03DA FF         0880            LI      X'F'
03DB 8C         0881            CALS    PUT_CHNL                * PUT CABLE BACK TO A
03DC FE         0882 TURN_OFF   LI      X'E'
03DD 8C         0883            CALS    PUT_CHNL                * TURN OFF REG BOX
03DE F7         0884            LI      X'7'
03DF 8C         0885            CALS    PUT_CHNL                * OFF COMMAND
03E0 3FD9       0886            SEMD    3,X'D9'
03E2 37DF       0887 RST_ACT    RMD     X'DF'                   * RESET ACTIVE COUNT
03E4 91E4       0888 C_DONE     CALL    ST57C
03E6 5B02       0889 COM_DONE   EDI     0,2             * ENTER STOP MODE
03E8 4A         0890            WI                      * WAIT FOR INTERRUPT
03E9 A228       0891            JMP     KE_DEC
                0892 *******************************
 = 03EB         0893 ONE_TEN EQU    *                  ONE TAN SUB
03EB 76CB       0894            LEAI    X'CB'
03ED 49E6       0895            STED    X'E6'
03EF 8E         0896            CALS    LP_E6_ST
03F0 940F       0897            CALL    NUM_DSP
03F2 FD         0898            LI      X'D'
03F3 53E6       0899            STD     X'E6'
03F5 8E         0900            CALS    LB_E6_ST
03F6 5A         0901            ICES
03F7 5D         0902            STXY
03F8 940F       0903            CALL    NUM_DSP
03FA 34         0904            RET
                0905 *******************************
 = 0400         0906            ORG     X'400'          * NUM DISPLAY
0400 AF         0907            DC      X'AF'
0401 06         0908            DC      X'06'
0402 CB         0909            DC      X'CB'
0403 4F         0910            DC      X'4F'
0404 66         0911            DC      X'66'
0405 6D         0912            DC      X'6D'
0406 ED         0913            DC      X'ED'
0407 07         0914            DC      X'07'
0408 EF         0915            DC      X'EF'
0409 6F         0916            DC      X'6F'
040A AF         0917            DC      X'AF'
040B 06         0918            DC      X'06'
040C CB         0919            DC      X'CB'
040D 00         0920            DC      X'00'
```

```
040E 40         0921          DC     X'40'
  = 040F        0922 NUM_DSP  EQU    *
040F 7600       0923          LEAI   X'00'
0411 17         0924          L
0412 0B         0925          ROTBL
                0926 *******************************
0413 49E4       0927 NUM_LD   STBD   X'E4'
0415 49E6       0928          LBD    X'E6'
0417 5D         0929          STXY
0418 1FE4       0930          LD     X'E4'
041A 57         0931          ST
041B 903F       0932          CALL   ICXY
041D F1         0933          LI     X'1'
041E 16         0934          N
041F 1CE5       0935          OD     X'E5'
0421 57         0936          ST
0422 34         0937          RET
                0938 *******************************
0423 725F       0939 OUT_EXE  OUT    5,X'F'           * DISPLAY LOAD
0425 46         0940          EXE
0426 21         0941          LICY
0427 34         0942          RET
  = 0428        0943 DSP_LOAD EQU    *
0428 77CA       0944          LXYI   X'CA'
042A 7603       0945          LEAI   X'03'
  = 042C        0946 PUT_IT   EQU    *
042C 9423       0947          CALL   OUT_EXE
042E 726F       0948          OUT    6,X'F'           * LOAD SEGS 0-3
0430 46         0949          EXE
0431 DF         0950          AI     X'F'
0432 BE2C       0951          CYIJ   X'E',PUT_IT
  = 0434        0952 HERE_OUT EQU    *
0434 7603       0953          LEAI   X'03'
  = 0436        0954 OUT_IT   EQU    *
0436 9423       0955          CALL   OUT_EXE
0438 727F       0956          OUT    7,X'F'
043A 46         0957          EXE
043B DF         0958          AI     X'F'
043C B042       0959          CYIJ   X'0',TWO_YET
043E 77D0       0960          LXYI   X'D0'
0440 A436       0961          JMP    OUT_IT
0442 B236       0962 TWO_YET  CYIJ   X'2',OUT_IT
  = 0444        0963 NEXT_OUT EQU    *
0444 7603       0964          LEAI   X'03'
  = 0446        0965 EXIT_IT  EQU    *
0446 9423       0966          CALL   OUT_EXE
0448 728F       0967          OUT    6,X'F'
044A 46         0968          EXE
044B DF         0969          AI     X'F'
044C B646       0970          CYIJ   X'6',EXIT_IT
  = 044E        0971 ONWARD   EQU    *
044E 7603       0972          LEAI   X'03'
0450 725F       0973          OUT    5,X'F'
```

```
0452 1FD6      0974           LD      X'D6'
0454 729F      0975           OUT     9,X'F'
0456 A352      0976           JMP     CONF_BGN
               0977 *
               0978 ******************************
     = 0458    0979 P_DAY_ON  EQU     *                    P_DAY_ON
0458 8B        0980           CALS    LB_E0_ST           * XY POINT TO DAY
0459 17        0981           L
045A EF        0982           CI      X'F'
045B 6E62      0983           JZ      S_S_12
045D 7F72      0984           JBNZ    3,ON_2
045F 3CD3      0985           SBMD    0,X'D3'            * SET FIRST
0461 34        0986           RET
0462 3CD2      0987 S_S_12    SBMD    0,X'D2'            * SET SUN
0464 3DCA      0988           SBMD    1,X'CA'            * SET SAT
0466 3CD1      0989 M_F_12    SBMD    0,X'D1'            * SET MON
0468 3DD1      0990           SBMD    1,X'D1'            * SET TUE
046A 3CD0      0991           SBMD    0,X'D0'            * SET WED
046C 3CCC      0992           SBMD    0,X'CC'            * SET THU
046E 3CCA      0993           SBMD    0,X'CA'            * SET FRI
0470 3CD3      0994           SBMD    0,X'D3'            * SET FIRST
0472 3DD3      0995 ON_2      SBMD    1,X'D3'            * SET SECOND
0474 34        0996           RET
               0997 ******************************
0475 8B        0998 STOPAMDS  CALS    LB_E0_ST           * STOP AM DISPLAY
0476 89        0999 STP_4     CALS    ICE_ST
0477 7B7E      1000           JBZ     3,AM_ON
0479 3FD2      1001 ST_PM     SBMD    3,X'D2'            * SET PM
047B 3AD2      1002           REMD    2,X'D2'            * CLEAR AM
047D 34        1003           RET
047E 3ED2      1004 AM_ON     SBMD    2,X'D2'            * SET AM
0480 3BD2      1005           REMD    3,X'D2'            * CLEAR PM
0482 34        1006           RET
               1007 ******************************
0483 8B        1008 STRTDS_L  CALS    LB_E0_ST
0484 9095      1009           CALL    IC_STX_9           * START AM DISPLAYS
0486 A48B      1010           JMP     LD_E_CH
0488 8B        1011 STRTDS    CALS    LB_E0_ST
0489 9093      1012           CALL    IC_STX_8
048B 17        1013 LD_E_CH   L
048C 797E      1014           JBZ     1,AM_ON
048E A479      1015           JMP     ST_PM
               1016 ******************************
               1017 *
     = 0490    1018 CLK_FLSH  EQU     *                    * CLOCK FLASH
0490 3AD6      1019           REMD    1,X'D6'            * CLEAR CLOCK
0492 1FD7      1020           LD      X'D7'
0494 7B98      1021           JBZ     3,CLK_OFF          * JMP IF FL2=0
0496 3DD6      1022           SBMD    1,X'D6'            * SET CLOCK
0498 34        1023 CLK_OFF   RET
               1024 ******************************
0499 93EB      1025 CHAN_ON   CALL    ONE_TEN            * CHANNEL DISPLAY
049B 8B        1026           CALS    LB_E0_ST
```

```
049C 909A      1027        CALL    IC_STX_4        * XY POINTS TO PROG INFO
049E 1FDC      1028        LD      X'DC'
04A0 7CB3      1029        JBNZ    0,A_B_LIT       * CHECK AB OR 100 BOX
04A2 76CF      1030        LEAI    X'CF'
04A4 49E6      1031        STBD    X'E6'
04A6 17        1032        L
04A7 78AD      1033        JBZ     0,HUN_CLR
04A9 7606      1034        LEAI    X'06'
04AB A4AF      1035        JMP     PUT_HUN
04AD 7600      1036 HUN_CLR LEAI   X'00'
04AF 9413      1037 PUT_HUN CALL   NUM_LD
04B1 A428      1038        JMP     DSP_LOAD
04B3 17        1039 A_B_LIT L
04B4 7SBC      1040        JBZ     0,CBL_A
04B6 3ACA      1041        RBMD    2,X'CA'         * RESET A
04B8 3FCA      1042        SBMD    3,X'CA'         * SET B
04BA A428      1043        JMP     DSP_LOAD
04BC 3BCA      1044 CBL_A  RBMD    3,X'CA'         * CLEAR B
04BE 3ECA      1045        SBMD    2,X'CA'         * SET A
04C0 A428      1046        JMP     DSP_LOAD
               1047 *************************
04C2 7670      1048 INITIAL LEAI   X'70'           * INITIAL
04C4 49E0      1049 PUT_INIT       STBD   X'E0'
04C6 9591      1050        CALL    CLEAR_IT
04C8 8B        1051        CALS    LB_E0_ST
04C9 9894      1052        CALL    IC_ST_10
04CB E0        1053        CI      X'0'
04CC 6AC4      1054        JNZ     PUT_INIT
04CE FE        1055 GO     LI      DASH
04CF 22        1056        STICY
04D0 45        1057        LY
04D1 E5        1058        CI      X'5'
04D2 6ACE      1059        JNZ     GO
04D4 5D        1060 PUT_0  STXY
04D5 F0        1061        LI      X'0'
04D6 57        1062        ST
04D7 5C        1063        LYY
04D8 59        1064        ICEA
04D9 CCE8      1065        CEAI    X'E8'
04DB 6AD4      1066        JNZ     PUT_0
               1067 ****************
04DD 91E4      1068        CALL    ST57C
04DF F4        1069        LI      X'4'
04E0 53E3      1070        STD     X'E3'
04E2 7661      1071        LEAI    X'61'
04E4 49C0      1072        STBD    X'C0'
04E6 3CD8      1073        SBMD    0,X'D8'
04E8 7668      1074        LEAI    136
04EA 82        1075        WTTB
04EB 7642      1076        LEAI    X'42'
04ED 81        1077        WTTC
04EE A123      1078        JMP     GO_IT
               1079 *****************************
04F0 33        1080 STP_PUT CALL   P_DECODE        * STOP PUT FOR COMP
```

```
04F1 9098        1081           CALL    IC_STX_6
04F3 1FE6        1082           LD      X'E6'
04F5 A609        1083           JMP     STRE_BY
                 1084 ********************************
04F7 77E6        1085 DAY_C_S   LXYI    X'E6'
04F9 A74E        1086           JMP     DAY_GO
                 1087 ********************************
04FB F8          1088 ST_57     LI      X'8'
04FC 53D9        1089           STD     X'D9'
04FE A1E4        1090           JMP     ST57C
1090 :warning : page boundary is changed
                 1091 ********************************
    = 0500       1092           ORG     X'500'                * PROG SET ROUTINE
    = 0500       1093 PROG_SET  EQU     *
0500 77D8        1094           LXYI    X'D8'
0502 17          1095           L                             * SEE IF REVIEWING
0503 7825        1096           JEZ     0,NT_FIRST            * CHK CLOCK MODE, JMP IF
                 1097 *                                         REVIEWING
0505 F0          1098           LI      X'0'
0506 22          1099           STICY                         * RESET CLK MODE
0507 F9          1100           LI      X'9'
0508 57          1101           ST                            * STORE=1
0509 F1          1102           LI      X'1'
050A 53E2        1103           STD     X'E2'                 * PROG (DASH IN START HOUR)
050C 7771        1104           LXYI    X'71'
    = 050E       1105 FIND_ONE  EQU     *
050E FE          1106           LI      DASH
050F 0F          1107           C
0510 6E21        1108           JZ      FND_ONE
0512 61E2        1109           ICMD    X'E2'                 * INCREMENT COUNT
0514 1FE2        1110           LD      X'E2'
0516 E9          1111           CI      X'9'                  * SEE IF ALL FULL
0517 6E1E        1112           JZ      OVER                  * IF YES, JMP
0519 5C          1113           LXY
051A 9054        1114           CALL    IC_ST_10
051C A50E        1115           JMP     FIND_ONE
051E F1          1116 OVER      LI      X'1'
051F 53E2        1117           STD     X'E2'
0521 88          1118 FND_ONE   CALS    F_DECODE
0522 F5          1119           LI      X'5'
0523 A541        1120           JMP     F_S_DONE
                 1121 ********************************************
                 1122 *
    = 0525       1123 NT_FIRST  EQU     *
0525 8D          1124           CALS    STR_CHK               * FIND WHICH STORE IS ON
0526 E1          1125           CI      X'1'
0527 6E38        1126           JZ      SND_HIT               * JMP IF SECOND PROG SET
0529 17          1127           L
052A 7D3E        1128           JBNZ    1,TRD_HIT             * CHECK FOR PS1 SET
052C 7E45        1129           JBNZ    2,FRTH_HIT            * CHECK FOR PS2
052E A110        1130           JMP     DISP_DCD              * JMP IF INVALID KEY
                 1131 *
    = 0530       1132 SND_HIT   EQU     *
```

```
0530 9A      1133        CALS    P_NUM_ON
0531 3DD9    1134        SBMD    1,X'D9'             * SET PS1
0533 3ED9    1135        REMD    0,X'D9'             * RESET STOREC_1
0535 8E      1136        CALS    LB_E0_ST            * XY TO CHANNEL
0536 91DC    1137        CALL    IC_STB_5            * E0 POINTS TO CHAN ONE
0538 FC      1138        LI      X'C'                * SET DISPLAY CODE
0539 A541    1139        JMP     P_S_DONE            * JMP TO DISPLAY
             1140 *
   = 053B    1141 TRD_HIT EQU    *
053B F4      1142        LI      X'4'
053C 57      1143        ST                          * SET PS2 RESET PS 1
053D 8B      1144        CALS    LB_E0_ST
053E 91DE    1145        CALL    IC_STB_3            * E0 POINTS TO STOP DAY
0540 FE      1146        LI      X'E'                * SET DISPLAY CODE
0541 53E3    1147 P_S_DONE STD   X'E3'
0543 A110    1148        JMP     DISP_DCD
             1149
             1150 *
   = 0545    1151 FRTH_HIT EQU   *
0545 F1      1152        LI      X'1'
0546 57      1153        ST                          * RESET PS2 SET CLOCK MODE
0547 F4      1154        LI      X'4'                * SET DISPLAY CODE
0548 53E3    1155        STD     X'E3'
054A 92F4    1156        CALL    P_NUM_CF
054C A7FC    1157        JMP     OV_DONE
             1158 *
             1159 *
             1160 ***********************************************
             1161 *
             1162 *    PROGRAM SELECT UP
             1163 *    E0-1 POINTS TO START DAY OF PROG
             1164 ***********************************************
   = 054E    1165 P_SEL_UP EQU   *
054E 77E2    1166        LXYI    X'E2'
0550 1FD6    1167        LD      X'D6'
0552 7B5E    1168        JBZ     3,P_SL_DN
0554 17      1169        L
0555 D1      1170        AI      X'1'
0556 E9      1171        CI      X'9'
0557 6F5A    1172        JC      DECODE
0559 F1      1173        LI      X'1'                * SEE IF AT PROG 8
   = 055A    1174 DECODE  EQU    *
055A 57      1175        ST
055B 88      1176        CALS    P_DECODE
055C A110    1177        JMP     DISP_DCD
             1178 *******************************
055E 17      1179 P_SL_DN L
055F DF      1180        AI      X'F'
0560 E0      1181        CI      X'0'
0561 6A5A    1182        JNZ     DECODE
0563 F8      1183        LI      X'8'
0564 A55A    1184        JMP     DECODE
             1185 *
```

```
1186 *****************************************
1187 *
1188 *    PROGRAM SELECT DOWN
1189 *    E0-1 POINTS TO START DAY OF PROG
1190 *
1191 *****************************************
1192 *****************************************
1193 *    A/B  TOGGLES CABLE
1194 *    E0 AT CHANNEL ONE
1195 *
1196 *****************************************
1197 *
1198 *****************************************
1199 *
1200 *
1201 *    DAY SET FOR PROGRAMS
1202 *
1203 *****************************************
        = 0566          1204 D_ST_INC    EQU    *
0566 8B                 1205         CALS   LB_E0_ST           * XY = DAY
0567 1FD6               1206         LD     X'D6'
0569 7B72               1207         JBZ    3,D_ST_DEC
056B 60                 1208 INC_IT ICM                        * INCREMENT DAY
056C 17                 1209         L
056D E7                 1210         CI     X'7'
056E 6E6B               1211         JZ     INC_IT
0570 A110               1212         JMP    DISP_DCD
                        1213 *
0572 FF                 1214 D_ST_DEC    LI     X'F'
0573 10                 1215         A
0574 57                 1216         ST
0575 E7                 1217         CI     X'7'
0576 6E72               1218         JZ     D_ST_DEC
0578 A110               1219         JMP    DISP_DCD
                        1220 ****************
                        1221 *****************************************
                        1222 *
                        1223 *
                        1224 *    DAY SET FOR CLOCK
                        1225 *
                        1226 *****************************************
        = 057A          1227 CK_D_INC    EQU    *
057A 8B                 1228         CALS   LB_E0_ST
057B 1FD6               1229         LD     X'D6'
057D 7E8A               1230         JBZ    3,CK_D_DEC
057F 17                 1231         L
0580 D1                 1232         AI     X'1'
0581 E7                 1233         CI     X'7'
0582 6E87               1234         JZ     BACK_SUN
0584 A1FC               1235         JMP    ST_JMP
                        1236 *
0586 F6                 1237 BACK_SAT    LI     X'6'
        = 0587          1238 BACK_SUN    EQU    *
```

```
0587 F0        1239           LI      X'0'
0588 A1FC      1240           JMP     ST_JMP
               1241 ******************************
058A 17        1242 CK_D_DEC  L
058B DF        1243           AI      X'F'
058C EF        1244           CI      X'F'
058D 6E86      1245           JZ      BACK_SAT
058F A1FC      1246           JMP     ST_JMP
               1247 ******************************************
               1248 ******************************************
     = 0591    1249 CLEAR_IT  EQU     *                    CLEAR ROUTINE
0591 8B        1250           CALS    LB_E0_ST
0592 9095      1251           CALL    IC_STX_9
0594 F0        1252           LI      X'0'
0595 57        1253 GO_CLR    ST
0596 5C        1254           LXY
0597 0DE9      1255           CD      Y'E9'
0599 6EA0      1256           JZ      CLR_DNE
059B 5A        1257           DCEA
059C 5D        1258           STXY
059D FE        1259           LI      DASH
059E A595      1260           JMP     GO_CLR
05A0 F0        1261 CLR_DNE   LI      X'0'
05A1 57        1262           ST                           * PUT 0 IN PROG INFO
05A2 34        1263           RET
               1264
               1265 *********************************************
               1266 *
               1267 *
               1268 *         AM/PM
               1269 *   TOGGLE AM PM    E0 AT MIN ONE
               1270 *
               1271 *********************************************
               1272 *****
     = 05A3    1273 ST_AM_TG  EQU     *
05A3 8B        1274           CALS    LB_E0_ST
05A4 9098      1275           CALL    IC_STX_6
05A6 F2        1276           LI      X'2'
05A7 A1FB      1277           JMP     X_JMP
               1278 *********************************************
               1279 *
               1280 *
               1281 *         CLEAR
               1282 *     DAY IN E0 BLANKS PROG
               1283 *
               1284 *
               1285 *********************************************
               1286 *
               1287 *         CLOCK SET
               1288 *
               1289 *********************************************
     = 05A9    1290 CLK_SET   EQU     *
05A9 3BC1      1291           RBMD    3,X'C1'              * STOP CLOCK
```

```
05AB 7600       1292            LEAI    X'06'
05AD 49C6       1293            STED    X'C6'
05AF F8         1294            LI      X'8'
05B0 1EC5       1295            ND      X'C5'
05B2 53C5       1296            STD     X'C5'
05B4 F6         1297            LI      X'6'
05B5 A328       1298            JMP     DST_JMP
                1299    *
                1300    *********************************
                1301    *
                1302    *
                1303    *     CHANNEL ENTER
                1304    *
                1305    *     E0 POINTS TO CHANNEL ONE
                1306    *********************************
                1307    *
        = 05B7  1308    CHAN_NTR EQU    *
05B7 8B         1309            CALS    LE_E0_ST
05B8 1FE7       1310            LD      X'E7'
05BA 27         1311            EXDC                    * STORE NEW ONE (A)=OLD ONE
        = 05BB  1312    REGULAR EQU     *
05BB EE         1313            CI      DASH
05BC 6EE6       1314            JZ      A_B_BOX
05BE 47         1315            EX                      * STORE NEW TEN (A)=OLD TEN
05BF E0         1316            CI      X'0'
05C0 6ED7       1317            JZ      SPECIAL
05C2 56         1318            STE                     *(E)=OLD TEN
05C3 42         1319            EXSE
05C4 1FDC       1320            LD      X'DC'
05C6 7CFA       1321            JBNZ    0,GO_DS         * JMP IF A/B/BOX
05C8 5C         1322    GO_TO_HU LXY
05C9 9099       1323            CALL    IC_STX_5
05CB 42         1324            EXSE
05CC 2F         1325            LE
05CD E1         1326            CI      X'1'
05CE 6AD3       1327            JNZ     CLR_HUN         * JMP IF OLD TEN NOT 1
05D0 14         1328            O                       * SET HUNDRED
05D1 A1FC       1329            JMP     ST_JMP
        = 05D3  1330    CLR_HUN EQU     *
05D3 FE         1331            LI      X'E'
05D4 16         1332            N                       * RESET HUNDRED .
05D5 A1FC       1333            JMP     ST_JMP
                1334    *
        = 05D7  1335    SPECIAL EQU     *
05D7 1FDC       1336            LD      X'DC'
05D9 7CE6       1337            JBNZ    0,A_B_BOX
05DB F0         1338            LI      X'0'
05DC 56         1339            STE
05DD 42         1340            EXSE
05DE 17         1341            L
05DF E0         1342            CI      X'0'
05E0 6AC8       1343            JNZ     GO_TO_HU
05E2 FD         1344            LI      BLANK
```

```
05E3 57         1345           ST
05E4 A5C8       1346           JMP     GO_TO_HU
                1347   *
     = 05E6     1348 A_B_BOX   EQU     *
05E6 FD         1349           LI      BLANK
05E7 A1FC       1350           JMP     ST_JMP
                1351   ****************************
     = 05E9     1352 SHOW_PRG  EQU     *           * SHOW FULL PROGS
05E9 37E2       1353           RMD     X'E2'
05EB 7771       1354           LXYI    X'71'
05ED 61E2       1355 CONTINUE  ICMD    X'E2'
05EF FE         1356           LI      DASH
05F0 0F         1357           C
05F1 6EF4       1358           JZ      NEXT_CHK
05F3 8A         1359           CALS    P_NUM_ON
05F4 5C         1360 NEXT_CHK  LXY
05F5 9094       1361           CALL    IC_ST_10
05F7 E1         1362           CI      X'1'
05F8 6AED       1363           JNZ     CONTINUE
05FA A110       1364 GO_IS     JMP     DISP_DCD
                1365   *
                1366   ****************************
     = 0600     1367           ORG     X'600'
     = 0600     1368 A_B       EQU     *
0600 8B         1369           CALS    LB_E0_ST
0601 909A       1370           CALL    IC_STX_4
0603 F1         1371           LI      X'1'
0604 A1FB       1372           JMP     X_JMP
                1373   ****************************
0606 89         1374 STRT_PUT  CALS    P_DECODE
0607 5D         1375           STXY
0608 21         1376           LICY
0609 5307       1377 STRE_D1   STD     X'07'
060B 17         1378 PUT_COM   L
060C 5305       1379           STD     X'05'
060E 908F       1380           CALL    ICXY
0610 5304       1381           STD     X'04'
0612 908F       1382           CALL    ICXY
0614 5303       1383           STD     X'03'
0616 5C         1384           LXY
0617 34         1385           RET
                1386   ****************************
     = 0618     1387           ORG     X'618'      * KEY SCAN
0618 FE         1388           DC      X'FE'
0619 FD         1389           DC      X'FD'
061A FB         1390           DC      X'FB'
061B F7         1391           DC      X'F7'
061C EF         1392           DC      X'EF'
061D DF         1393           DC      X'DF'
061E BF         1394           DC      X'BF'
061F 7F         1395           DC      X'7F'
                1396   *************
0620 7600       1397 KEY_SCAN  LEAI    X'00'
```

```
0622 7020      1398           OUTEA    2
0624 0B        1399           RDTBL
0625 0B        1400           RDTBL
0626 0B        1401           RDTBL
0627 734F      1402           IN       4,X'F'
0629 EF        1403           CI       X'F'
062A 07        1404           SC
062B 6E48      1405           JZ       GO_OFF
062D C8        1406           LYI      X'8'
062E 45        1407 CON_SCAN  LY                       * (A)=TABLE PTR
062F 33F1      1408           LMEI     X'F',1          * (E)=1
0631 0B        1409           RDTBL
0632 7020      1410           OUTEA    2
0634 0B        1411           RDTBL
0635 0B        1412           RDTBL                    * 8 CYCLE WAIT
0636 0B        1413           RDTBL
0637 33FF      1414           LMEI     X'F',X'F'       *(E)=F
0639 734F      1415           IN       4,X'F'
063B 02        1416           CPL
063C 6E45      1417           JZ       KEY_NEXT        * JMP IF NO KEY
063E 6B53      1418           JNC      KEY_DBL         * TWO KEY PRESS
0640 03        1419           RC
0641 54        1420           STX                      * SAVE INPUT IN X
0642 45        1421           LY
0643 53DD      1422           STD      WORK            * STORE SCAN DATA
0645 5E2E      1423 KEY_NEXT  ICYJ     CON_SCAN
               1424 *
0647 44        1425           LX
0648 77DB      1426 GO_OFF    LXYI     KEY_MSD
064A 6F6F      1427           JC       KEY_OFF
               1428 *
064C 5F4E      1429 KEY_TEST  ICEJ     TEST2
064E 09        1430 TEST2     ROR
064F 6B4C      1431           JNC      KEY_TEST
0651 6E57      1432           JZ       ONE_KEY
               1433 *
0653 3ADB      1434 KEY_DBL   REMD     KEY_JOB,KEY_MSD
0655 A698      1435           JMP      CLOCK
0657 17        1436 ONE_KEY   L
0658 3DD2      1437           SBMD     KEY_BNCE,KEY_MSD
065A 7998      1438           JEZ      KEY_BNCE,CLOCK
065C 3ED8      1439           SBMD     KEY_JOB,KEY_MSD
065E 3FD9      1440           SBMD     3,X'D9'
0660 33DB      1441           RBMD     0,KEY_MSD
0662 2F        1442           LE
0663 03        1443           RC
0664 09        1444           ROR
0665 14        1445           O
0666 26        1446           STDCY
0667 1FDD      1447           LD       WORK
0669 6F6C      1448           JC       KEY_SAVE
066B D8        1449           AI       X'8'
066C 57        1450 KEY_SAVE  ST
```

```
066D A690        1451            JMP     CLOCK
066F 76FE        1452 KEY_OFF    LEAI    X'FE'
0671 7026        1453            OUTEA   2
0673 17          1454            L
0674 39DB        1455            RBMD    KEY_BNCE,KEY_MSD
0676 7D90        1456            JBNZ    KEY_BNCE,CLOCK
0678 3BDB        1457            RBMD    3,KEY_MSD
067A 3ADB        1458            RBMD    KEY_JOB,KEY_MSD
067C 77DC        1459            LXYI    SWITCH
067E 7303        1460            IN      0,B'0011'
0680 56          1461            STE
0681 15          1462            X
0682 7C86        1463            JBNZ    0,CHANGE
0684 798E        1464            JBZ     1,NO_CNGE
0686 3FDC        1465 CHANGE     SBMD    3,SWITCH
0689 7B90        1466            JBZ     3,CLOCK
068A 2F          1467            LE
068B 57          1468            ST
068C A690        1469            JMP     CLOCK
068E 3BDC        1470 NO_CNGE    RBMD    3,SWITCH
                 1471 **********************************************************
                 1472 **********************************************************
                 1473 *
                 1474 *          CLOCK UPKEEP ROUTINE
                 1475 *
                 1476 **********************************************************
                 1477 *
     = 0690      1478 CLOCK      EQU     *
0690 61D7        1479            ICMD    X'D7'
0692 61D7        1480            ICMD    X'D7'           * FLASH FOR DISPLAY
0694 1FC1        1481            LI      X'C1'           * SEE IF CLOCK RUN ON
0696 7BD5        1482            JBZ     3,CLK_DNE       * IF NOT, DONE
0698 77C7        1483            LXYI    X'C7'
069A 60          1484 INC        ICM
069B 6BD5        1485            JNC     CLK_DNE
069D 24          1486            DCY
069E E59A        1487            CYIJ    5,INC
06A0 60          1488            ICM                     * INCREMENT HI SEC COUNT
06A1 25          1489            LDCY                    * GET HI BYTE
06A2 7AD5        1490            JBZ     2,CLK_DNE
06A4 3AC5        1491            RBMD    2,X'C5'
06A6 3FD9        1492            SBMD    3,K_59
06A8 F6          1493            LI      X'6'
06A9 60          1494 A_INC      ICM
06AA 10          1495            A
06AB 6BD5        1496            JNC     CLK_DNE
06AD 26          1497            STDCY
06AE FA          1498            LI      X'A'
06AF 22A9        1499            CYIJ    2,A_INC
06B1 60          1500            ICM
06B2 F3          1501            LI      X'3'
06B3 10          1502            A
06B4 6FD3        1503            JC      WAS_12
```

```
06B6 EF          1504           CI      15
06B7 6AD5        1505           JNZ     CLK_DNE
06B9 20          1506           ICY
06BA 20          1507           ICY
06BB 20          1508           ICY
06BC F8          1509           LI      8
06BD 10          1510           A
06BE 57          1511           ST
06BF 7FD5        1512           JBNZ    3,CLK_DNE
06C1 C1          1513           LYI     1
06C2 F1          1514           LI      1
06C3 60          1515           ICM
06C4 10          1516           A
06C5 6BC9        1517           JNC     CNG_COM
06C7 F8          1518           LI      8
06C8 57          1519           ST
    = 06C9       1520 CNG_COM   EQU     *
06C9 1FD7        1521           LD      X'D7'
06CB 78D5        1522           JBZ     0,CLK_DNE         * IF HAVEN'T HAD FIRST PROG
06CD 24          1523           DCY
                 1524 *                                    * HIT DONE
                 1525 *                                    * XY POINT TO COMP DAY
06CE F1          1526           LI      X'1'
06CF 60          1527           ICM
06D0 10          1528           A
06D1 6BD5        1529           JNC     CLK_DNE
06D3 F1          1530 WAS_12    LI      1
06D4 57          1531           ST
    = 06D5       1532 CLK_DNE   EQU     *
06D5 6D          1533           POPXY                     * RESTORE XY
06D6 6C          1534           POPEA                     *"  "   EA
06D7 5B02        1535           EDI     0,2               * ENABLE INTERRUPTS
06D9 35          1536           RETI
                 1537 *********************************
                 1538 *********************************
                 1539 *
    = 06DA       1540 INTERRUP  EQU     *
06DA 5B20        1541           EDI     2,0               * DISABLE INTERRUPTS
06DC 68          1542           PSHEA
06DD 69          1543           PSHXY                     * SAVE REGISTERS
                 1544 *
                 1545 * CHECK TO SEE IF IR OUT THIS TIME
                 1546 *
                 1547 *********************************
06DE 1FC9        1548           LD      IRD2              * LOAD IR COUNT
06E0 D4          1549           AI      X'4'              * INCREMENT COUNT
06E1 53C9        1550           STD     IRD2              * AND STORE
06E3 7920        1551           JBZ     1,KEY_SCAN        * JMP IF NO IR
06E5 D2          1552           AI      X'2'              * ADD 2 TO OLD COUNT
06E6 6B90        1553           JNC     CLOCK             * IF CARRY, IR
06E8 32F2        1554           LMXI    X'F',2            * SET X = 2
06EA 9053        1555           CALL    IRST
06EC 1FC9        1556           LD      IRD2              * GET MSB
```

```
06EE 37C9      1557          RMD     IRD2         * CLEAR IR READY
06F0 09        1558          ROR                  * CARRY = MSB
06F1 C8        1559          LYI     X'8'
06F2 9046      1560 IRNEXT   CALL    IROUT
06F4 45        1561          LY
06F5 6E90      1562          JZ      CLOCK
06F7 03        1563          RC                   * RESET CARRY
06F8 09        1564          ROR
06F9 55        1565          STY
06FA 08        1566          ROL
06FB 1EC8      1567          ND      IRD1
06FD DF        1568          AI      X'F'
06FE A6F2      1569          JMP     IRNEXT
1569 ;warning : page boundary is changed
               1570 ****************************
= 0700         1571          ORG     X'700'       * OVER LAP FIND
               1572 ****************************
0700 972F      1573 COM_MORE CALL    DAY_CNGE
0702 94F7      1574          CALL    DAY_C_S
0704 7CD5      1575          JBNZ    0,THIS_OK
0706 79F1      1576          JBZ     1,OL
0708 978E      1577          CALL    STP_HMC
070A E0        1578          CI      X'0'
070B 6EF1      1579          JZ      OL
070D A7D5      1580          JMP     THIS_OK
               1581 ****************************
070F 1FE2      1582 COM_LESS LD      X'E2'
0711 53E5      1583          STD     X'E5'
0713 1FE4      1584          LD      X'E4'
0715 53E2      1585          STD     X'E2'
0717 972F      1586          CALL    DAY_CNGE
0719 94F0      1587          CALL    STP_PUT
071B 89        1588          CALS    ICE_ST
071C 9039      1589          CALL    STP_AM
071E 57        1590          ST
071F 1FE5      1591          LD      X'E5'
0721 53E2      1592          STD     X'E2'
0723 974C      1593          CALL    DAY_C
0725 7CF1      1594          JBNZ    0,OL
0727 79D5      1595          JBZ     1,THIS_OK
0729 975B      1596          CALL    STRT_HMC
072B 7CF1      1597          JBNZ    0,OL
072D A7D5      1598          JMP     THIS_OK
               1599 ****************************
072F 88        1600 DAY_CNGE CALS    P_DECODE
0730 5D        1601          STXY
0731 17        1602          L
0732 53E6      1603          STD     X'E6'
0734 EF        1604          CI      X'F'
0735 6E4B      1605          JZ      ONE_DAY
0737 5C        1606          LXY
0738 9095      1607          CALL    IC_ST1_9
073A FA        1608          LI      B'1010'
```

```
073B 16        1609            N
073C E2        1610            CI      X'2'
073D 6A4B      1611            JNZ     ONE_DAY
073F 1FE6      1612            LD      X'E6'
0741 EE        1613            CI      X'E'
0742 6A45      1614            JNZ     CHK_6
0744 D1        1615 ADD_1      AI      X'1'
0745 E6        1616 CHK_6      CI      X'6'
0746 6E44      1617            JZ      ADD_1
0748 D1        1618            AI      X'1'
0749 53E6      1619            STD     X'E6'
074B 34        1620 ONE_DAY    RET
               1621 *************************
074C 88        1622 DAY_C      CALS    F_DECODE
074D 5D        1623            STXY
074E 1F07      1624 DAY_GO     LD      X'07'
0750 EF        1625            CI      X'F'
0751 6E8A      1626            JZ      EXACT
0753 17        1627            L
0754 EF        1628            CI      X'F'
0755 6E8A      1629            JZ      EXACT
0757 0D07      1630            CD      X'07'
0759 6786      1631            JMP     RESULT
               1632 ***************
075B 88        1633 STRT_HMC   CALS    P_DECODE
075C 9095      1634            CALL    IC_STX_9
075E 979D      1635            CALL    STRT_AM
0760 0F        1636            C
0761 6F8C      1637            JC      DAY_LESS
0763 6A8B      1638            JNZ     DAY_MORE
0765 88        1639            CALS    P_DECODE
0766 9090      1640 HMC_SME    CALL    ICE_ST
0768 1F05      1641            LD      X'05'
076A EC        1642            CI      12
076B 6A6F      1643            JNZ     DONT_CG
076D 3705      1644            RMD     X'05'
076F 17        1645 DONT_CG    L
0770 EC        1646            CI      12
0771 6A74      1647            JNZ     C_DIR
0773 F0        1648            LI      X'0'
0774 0D05      1649 C_DIR      CD      X'05'
0776 6F8C      1650            JC      DAY_LESS
0778 6A8B      1651            JNZ     DAY_MORE
077A 903F      1652            CALL    ICXY
077C 0D04      1653            CD      X'04'
077E 6F8C      1654            JC      DAY_LESS
0780 6A8B      1655            JNZ     DAY_MORE
0782 903F      1656            CALL    ICXY
0784 0D03      1657            CD      X'03'
0786 6F8C      1658 RESULT     JC      DAY_LESS
0788 6A8B      1659            JNZ     DAY_MORE
078A F2        1660 EXACT      LI      X'2'
078B F0        1661 DAY_MORE   LI      X'0'
```

```
078C F1        1662 DAY_LESS    LI      X'1'
078D 34        1663            RET
               1664 **************************
076E 88        1665 STP_HMC CALS P_DECODE
078F 9095      1666            CALL    IC_STX_9
0791 9039      1667            CALL    STP_AM
0793 0F        1668            C
0794 6F8C      1669            JC      DAY_LESS
0796 6A3B      1670            JNZ     DAY_MORE
0798 88        1671            CALS    P_DECODE
0799 9099      1672            CALL    IC_STX_5
079B A766      1673            JMP     HMC_SME
               1674 **************************
079D FD        1675 STRT_AM LI      B'1101'
079E 14        1676            C
079F 07        1677            SC
07A0 09        1678            ROR
07A1 7706      1679 XY_TO_06    LXYI    X'06'
07A3 34        1680            RET
               1681 *********************
               1682
     = 07A4    1683 ROTATE EQU     *
07A4 8B        1684            CALS    LB_E0_ST
07A5 1FE7      1685            LD      X'E7'
07A7 27        1686            EXDCY                    * (A)=OLD ONE  (XY)=NEW ONE
07A8 BFAC      1687            CYIJ    X'F',R_ON
07AA 320F      1688            LMXI    0,X'F'
     = 07AC    1689 R_ON   EQU     *
07AC 27        1690            EXDCY                    * (A)=OLD TEN (XY)=NEW TEN
07AD BFB1      1691            CYIJ    X'F',MORE_TG
07AF 320F      1692            LMXI    0,X'F'
     = 07B1    1693 MORE_TG EQU    *
07B1 56        1694            STE                      * (E)=OLD TEN
07B2 17        1695            L                        * (A)=OLD HOUR
07B3 E1        1696            CI      X'1'             * IF OLD HOUR=1
07B4 6EB9      1697            JZ      CHK_F12          * JMP
07B6 2F        1698            LE                       * ELSE PUT IN NEW HOUR
07B7 A1FC      1699            JMP     ST_JMP
               1700 *
     = 07B9    1701 CHK_F12 EQU    *
07B9 46        1702            EXE                      * IF OLD TEN LESS THAN 3
07BA E3        1703            CI      X'3'
07BB 6BBE      1704            JNC     ST_J_JMP         * JMP
               1705 *
     = 07BD    1706 OK_NUM EQU     *
07BD DA        1707            AI      X'A'             * ADD 10 TO NUMBER
07BE A1FC      1708 ST_J_JMP    JMP     ST_JMP
               1709 *
               1710 ****************************************
               1711 ****************************************
07C0 9591      1712 CLEAR  CALL    CLEAR_IT
07C2 3CD8      1713            SBMD    0,X'D8'          * SET CLOCK MODE
07C4 92F4      1714            CALL    P_NUM_OF
07C6 A7FC      1715            JMP     OV_DONE
```

```
                    1716  ************************************
67C8 9606           1717  OVR_BGN CALL    STRT_PUT
07CA 9093           1718          CALL    IC_STX_6
07CC 979D           1719          CALL    STRT_AM
07CE 57             1720          ST
07CF 77E2           1721          LXYI    X'E2'
07D1 F0             1722          LI      X'0'
07D2 47             1723          EX
07D3 53E4           1724          STD     X'E4'
07D5 77E2           1725  THIS_OK LXYI    X'E2'
07D7 60             1726  SAME    ICM
07D8 17             1727          L
07D9 E9             1728          CI      X'9'
07DA 6EFC           1729          JZ      OV_DONE
07DC 0DE4           1730          CD      X'E4'
07DE 6ED7           1731  *       JZ      SAME           * COMP TO DASH
07E0 88             1732          CALS    P_DECODE
07E1 89             1733          CALS    ICE_ST
07E2 EE             1734          CI      X'E'
07E3 6ED5           1735          JZ      THIS_OK
07E5 974C           1736          CALL    DAY_C
07E7 7C06           1737          JENZ    0,COM_MORE
07E9 790F           1738          JEZ     1,COM_LESS
07EB 975B           1739          CALL    STRT_HMC
07ED 7C06           1740          JENZ    0,COM_MORE
07EF 790F           1741          JEZ     1,COM_LESS
07F1 1FE2           1742  OL      LD      X'E2'
07F3 5307           1743          STD     X'07'
07F5 1FE4           1744          LD      X'E4'
07F7 5306           1745          STD     X'06'
07F9 FF             1746          LI      X'F'
07FA 53E3           1747          STD     X'E3'
07FC 94FB           1748  OV_DONE CALL    ST_57
07FE A5E9           1749          JMP     SHOW_PRG
 749 :warning : page boundary is changed
                    1750  ************************************
                    1751          END
```

What is claimed is:

1. In combination:
a converter for receiving a plurality of television signals at different channel frequencies, converting them to a single channel frequency and supplying said single channel frequency to an output;
selection means in said converter for selecting among said different channel frequencies in response to remotely transmitted channel command signals;
a VCR having an input coupled to the output of said converter and tuned to said single channel frequency for recording television signals therefrom;
program means, including timer means, in said VCR for initiating and terminating recording by said VCR in response to a user programmed time schedule for said timer means; and
user programmable remote transmitter means, including timer means, for automatically transmitting channel command signals to operate said selection means in said converter to convert user desired channel frequency signals to said single channel frequency at said output for recording by said VCR when said VCR is programmed by a user to correspond with said programmed time schedule.

2. The combination of claim 1, wherein said converter includes ON/OFF means for turning said converter ON/OFF in response to remotely transmitted ON/OFF command signals from said transmitter means and wherein said transmitter means further includes means enabling user programming of the times for transmission of said ON/OFF command signals to said converter.

3. The combination of claim 2, wherein all said remotely transmitted command signals comprise coded bursts of infra-red energy.

4. The method of operating a video system including a remotely controllable converter tunable to a plurality of television signal channel frequencies and for converting them to a single channel frequency output, and a user programmable VCR, including timer means, coupled to the single frequency output of the converter comprising the steps of:

providing a user programmable remote command signal transmitter, including timer means, adapted for controlling operation of said converter;

programming said transmitter with events, comprising the time, desired channel frequencies and time duration information, for automatically operating said converter for converting the desired ones of said different television channel frequencies to said single channel frequency at the single frequency output of the converter; and programming said VCR with corresponding recording time and time duration information for said events.

5. The method of claim 4 wherein said converter includes means for being turned ON/OFF responsive to a corresponding ON/OFF control signal and wherein said steps further include the steps of:

programming said transmitter to generate an ON signal for said converter at a first time;

programming said transmitter to generate an OFF signal for said converter at a second time; and programming said VCR to turn ON and OFF at times corresponding to said first and second times.

* * * * *